US012548746B2

(12) United States Patent
Kim et al.

(10) Patent No.: US 12,548,746 B2
(45) Date of Patent: Feb. 10, 2026

(54) PHYSICAL VAPOR DEPOSITION APPARATUS

(71) Applicant: SAMSUNG ELECTRONICS CO., LTD., Suwon-si (KR)

(72) Inventors: Jaesuk Kim, Hwaseong-si (KR); Sangwook Park, Seongnam-si (KR); Gukrok Yun, Seoul (KR); Kyuhee Han, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 344 days.

(21) Appl. No.: 17/849,914

(22) Filed: Jun. 27, 2022

(65) Prior Publication Data

US 2023/0175113 A1 Jun. 8, 2023

(30) Foreign Application Priority Data

Dec. 8, 2021 (KR) ........................ 10-2021-0174751

(51) Int. Cl.

*H01J 37/34* (2006.01)
*C23C 14/35* (2006.01)
*H01J 37/32* (2006.01)

(52) U.S. Cl.

CPC ........ *H01J 37/3458* (2013.01); *C23C 14/351* (2013.01); *C23C 14/354* (2013.01); *H01J 37/32651* (2013.01); *H01J 37/3402* (2013.01); *H01J 37/3408* (2013.01);

(Continued)

(58) Field of Classification Search

CPC ............... H01J 37/3405; H01J 37/3441; H01J 37/3447; H01J 37/345; H01J 37/32651; H01J 37/3402; H01J 37/3458; C23C 14/354; C23C 14/351

See application file for complete search history.

(56) References Cited

U.S. PATENT DOCUMENTS

| | | | | |
|---|---|---|---|---|
| 5,234,560 | A * | 8/1993 | Kadlec .................... | C23C 14/35 427/523 |
| 6,192,829 | B1 | 2/2001 | Karazim et al. | |
| 6,358,376 | B1 | 3/2002 | Wang et al. | |

(Continued)

FOREIGN PATENT DOCUMENTS

| | | | | |
|---|---|---|---|---|
| JP | 5795002 B2 * | 10/2015 | ......... | C23C 14/3492 |
| KR | 10-2008-0100617 | 11/2008 | | |

OTHER PUBLICATIONS

Machine Translation JP 5795002 (Year: 2015).*

*Primary Examiner* — Michael A Band
(74) *Attorney, Agent, or Firm* — Morgan, Lewis & Bockius LLP

(57) ABSTRACT

A physical vapor deposition (PVD) apparatus includes: a vacuum chamber; a pedestal arranged in the vacuum chamber and configured to support a substrate; a target arranged on the vacuum chamber and including a deposition material; a shield arranged on an inner sidewall of the vacuum chamber to protect the vacuum chamber from the deposition material; a target power supply applying a target voltage to the target to generate plasma in the vacuum chamber; and a magnet configured to induce the plasma to the target; and a magnetic field formation line connected with the target power supply, wherein the magnetic field formation line surrounds the shield symmetrically with respect to a center of the shield to form a magnetic field in the vacuum chamber.

3 Claims, 15 Drawing Sheets

(52) U.S. Cl.
CPC ...... *H01J 37/3441* (2013.01); *H01J 37/3447* (2013.01); *H01J 37/345* (2013.01)

(56) References Cited

U.S. PATENT DOCUMENTS

| | | | | |
|---|---|---|---|---|
| 6,369,348 | B2 | 4/2002 | Qian et al. | |
| 6,475,333 | B1 | 11/2002 | Uchida | |
| 7,871,490 | B2 | 1/2011 | Kim et al. | |
| 9,062,372 | B2 * | 6/2015 | Gopalraja ......... | H01J 37/32706 |
| 10,811,226 | B2 | 10/2020 | Carducci et al. | |
| 2017/0253959 | A1 * | 9/2017 | Wang .................. | H01J 37/3441 |
| 2020/0185192 | A1 | 6/2020 | Carducci et al. | |

* cited by examiner

DR : 5.88nm/sec, Skew : 0.05nm/sec (±0.88%)
Max : 0.11(0.02), Mean : 5.88(1), Min : -0.1(-0.02)
Range : 0.21(+1.89% ~ -1.72%), Mean : 5.88nm/sec
Sigma(68.3%): ±0.88%, 3Sigma(99.73%) : ±2.65%

Max : 6.28(1.08), Mean : 5.84(1), Min : 5.43(0.93)
Range : 0.85(+7.59% ~ -7.02%), Mean : 5.84nm/sec
Sigma(68.3%): ±4.13%, 3Sigma(99.73%) : ±12.38%

Max : 6.22(1.06), Mean : 5.88(1), Min : 5.63(0.96)
Range : 0.57(+5.75% ~ -4.21%), Mean : 5.88nm/sec
Sigma(68.3%): ±2.87%, 3Sigma(99.73%) : ±8.61%

PHYSICAL VAPOR DEPOSITION APPARATUS

CROSS-REFERENCE TO RELATED APPLICATION

This application claims priority under 35 U.S.C. § 119 to Korean Patent Application No. 10-2021-0174751, filed on Dec. 8, 2021 in the Korean Intellectual Property Office (KIPO), the disclosure of which is incorporated b reference herein in its entirety.

TECHNICAL FIELD

Example embodiments of the present inventive concept relate to a physical vapor deposition apparatus. More particularly, example embodiments of the present in concept relate to a physical vapor deposition apparatus configured to deposit a material, which may be released from a target against which ions of plasma in a vacuum chamber may collide, on a semiconductor substrate.

DISCUSSION OF THE RELATED ART

Generally, a physical vapor deposition (PVD) apparatus may typically include a vacuum chamber, a shield, a target, a magnet, a shield power supply, a target power supply, a pedestal, etc. The shield power supply may apply a shield voltage to the shield. The target power supply may apply a target voltage to the target to generate plasma in the vacuum chamber. The magnet may be arranged on the target to form a magnetic field.

According to related arts, the target power supply may be connected with the target through a first line. The first line may be grounded to an external structure of the vacuum chamber. Further, the shield power supply may be connected with the shield through a second line. The first line and/or the second line may be asymmetrically arranged with respect to a center of the shield. The asymmetrical first line and/or the second line may generate an asymmetrical magnetic field. The asymmetry of the magnetic field may cause a non-uniform distributions of the plasma.

SUMMARY

Example embodiments of the present inventive concept provide a physical vapor deposition apparatus that may form a symmetrical magnetic field in a vacuum chamber.

According to an example embodiment of the present inventive concept, a physical vapor deposition (PVD) apparatus includes: a vacuum chamber; a pedestal arranged in the vacuum chamber and configured to support a substrate; a target arranged on the vacuum chamber and including a deposition material; a shield arranged on an inner sidewall of the vacuum chamber to protect the vacuum chamber from the deposition material; a target power supply applying a target voltage to the target to generate plasma in the vacuum chamber; and a magnet configured to induce the plasma to the target; and a magnetic field formation line connected with the target power supply, wherein the magnetic field formation line surrounds the shield symmetrically with respect to a center of the shield to forma magnetic field in the vacuum chamber.

According to an example embodiment of the present inventive concept, a physical vapor deposition (PVD) apparatus includes: a vacuum chamber; a pedestal arranged in the vacuum chamber and configured to support a substrate; a target arranged on the vacuum chamber and including a deposition material; a shield arranged on an inner sidewall of the vacuum chamber to protect the vacuum chamber from the deposition material; a target power supply applying a target voltage to the target to generate plasma in the vacuum chamber; and a magnet configured to induce the plasma to the target; a magnetic field formation line having a first connection point connected with the target power supply, wherein the magnetic field formation line has an annular shape configured to surround the shield symmetrically with respect to a center of the shield to form a magnetic field in the vacuum chamber; and a ground line connected to a second connection point of the magnetic field formation line, Wherein the second connection point is symmetrical with the first connection point with respect to the center of the shield.

According to an example embodiment of the present inventive concept, a physical vapor deposition (PVD) apparatus includes: a vacuum chamber; a pedestal arranged in the vacuum chamber and configured to support a substrate; a target arranged on a first surface of the vacuum chamber and including a deposition material; a shield arranged on an inner sidewall of the vacuum chamber to protect the vacuum chamber from the deposition material; a target power supply applying a target voltage to the target to generate plasma in the vacuum chamber; and a magnet configured to induce the plasma to the target; a power line connected to the target power supply and a first portion of the vacuum chamber; and a ground line connected to a second portion of the vacuum chamber, wherein the second portion is symmetrical with the first portion with respect to a center of the shield.

BRIEF DESCRIPTION OF THE DRAWINGS

The above and other features of the present inventive concept will become more apparent by describing in detail example embodiments thereof, with reference to the accompanying, drawings, in which.

DETAILED DESCRIPTION OF THE EMBODIMENTS

Hereinafter, example embodiments of the present inventive concept will be described in detail with reference to the accompanying drawings.

Figure 1:
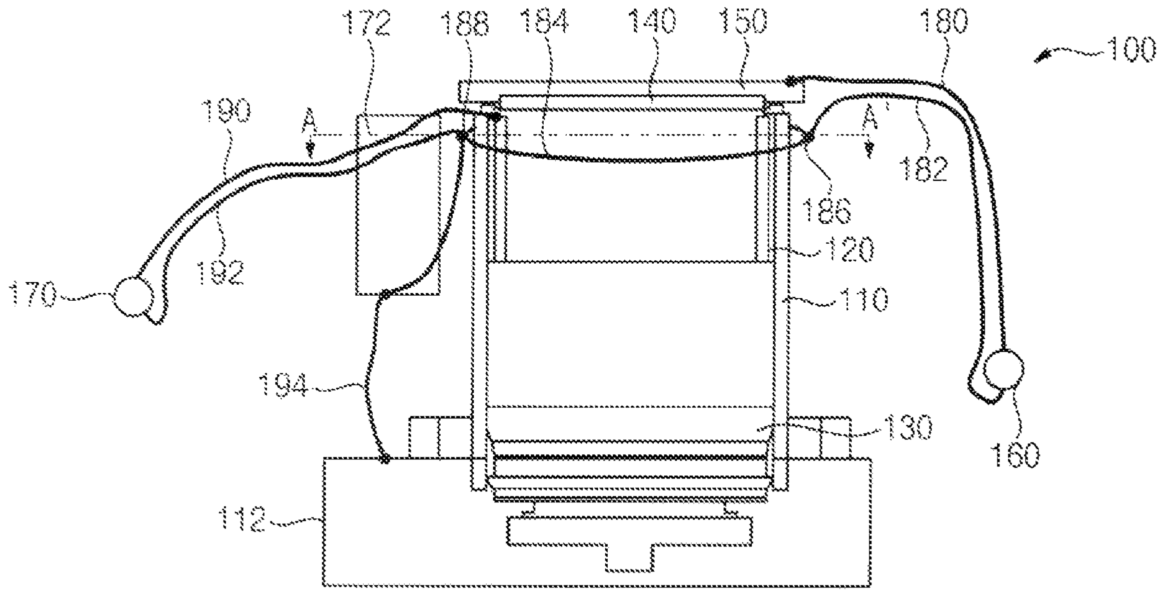
FIG. 1 is a cross-sectional view illustrating a physical vapor deposition (PVD) apparatus in accordance with an example embodiment of the present inventive concept.
Figure 2:
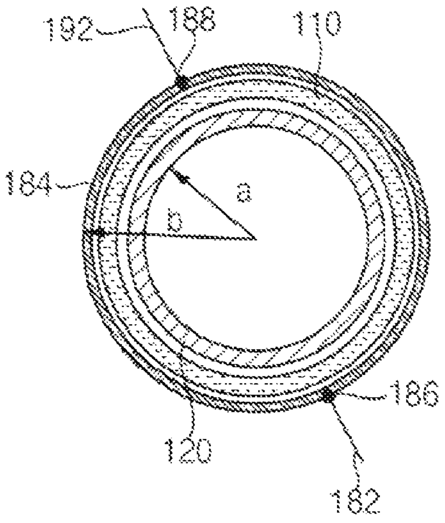
FIG. 2 is a cross-sectional view taken along a line A-A' in FIG. 1 in accordance with an example embodiment of the present inventive concept.

FIG. 1 is a cross-sectional view illustrating a physical vapor deposition (PVD) apparatus in accordance with an example embodiment of the present inventive concept, and FIG. 2 is a cross-sectional view taken along a line A-A' FIG. 1.

Referring to FIGS. 1 and 2, a PVD apparatus 100 according to an example embodiment of the present inventive concept may include a vacuum chamber 110, a shield 120, a pedestal 130, a target 140, a magnet 150, a target power supply 160, a shield power supply 170 and a magnetic field formation line 184.

The vacuum chamber 110 may have an inner space configured to receive a substrate. The substrate may include, for example, a semiconductor substrate, but the present inventive concept is not limited thereto. The inner space of the vacuum chamber 110 may receive vacuum from a vacuum pump. Plasma may be formed in the inner space of the vacuum chamber 110. The vacuum chamber 110 may include a conductive material or a non-conductive material. If the vacuum chamber 110 includes the conductive material, the vacuum chamber 110 may include a metal, but the present inventive concept is not limited thereto. Further, the vacuum chamber 110 may have a cylindrical shape, but the present inventive concept is not limited thereto.

The shield 120 may be arranged on an inner sidewall of the vacuum chamber 110. The shield 120 may protect the vacuum chamber 110 from a deposition material formed on the semiconductor substrate. For example, the shield 120 may include a conductive material such as a metal. The shield 120 may have an annular shape, but the present inventive concept is not limited thereto.

The pedestal 130 may be arranged in a lower region of the inner space of the vacuum chamber 110. The semiconductor substrate may be placed on an upper surface of the pedestal 130.

The target 140 may be arranged on an upper surface of the vacuum chamber 110. The target 140 may include the deposition material. For example, the deposition material may be for deposited on a substrate. An upper end of the shield 120 may be positioned adjacent to an edge portion of the target 140. For example, the shield 120 may be spaced apart from the target 140.

The magnet 150 may be arranged on the target 140. The magnet 150 may induce the plasma in the inner space of the vacuum chamber 110 to the target 140 to concentrate the plasma under the target 140. For example, the magnet 150 may include a permanent magnet. The magnet 150 may have a fixed structure. In addition, the magnet 150 may have a rotary structure. In this case, the magnet 150 may be rotated with respect to a center of the target 140. Thus, the plasm may also be rotated with respect to the center of the target 140 by the rotation of the magnet 150.

The target power supply 160 mays electrically connected to the target 140. The target power supply 160 may apply a target power to the target 140 to generate the plasma in the inner space of the vacuum chamber 110. For example, the target power supply 160 may apply a direct current (DC) voltage of about −600V to the target 140.

For example, the target power supply 160 may be connected with the target 140 through a first power line 180. A second power line 182 extended from the target power supply 160 may be positioned adjacent to an outer sidewall of the shield 120. For example, the second power line 182 may be connected to an outer sidewall of the vacuum chamber 110. The first power line 180 and the second power line 182 may include cables.

In an example embodiment of the present inventive concept, the target power supply 160 may be connected to the magnet 150 through the first power line 180.

The shield power supply 170 may be electrically connected with the shield 120 to apply a shield voltage to the shield 120. The shield power supply 170 may be connected with the shield 120 through a first shield line 190. For example, the first shield line 190 may be connected to the upper end of the shield 120. For example, the shield power supply 170 may apply a DC voltage of about +100V to the shield 120. Additionally, an RF filter 172 may be arranged between the shield power supply 170 and the shield 120. The first shield line 190 may include a cable.

The magnetic field formation line 184 may be configured to surround an outer sidewall of the vacuum chamber 110. For example, the magnetic field formation line 184 may be configured to surround the outer sidewall of the shield 120. Thus, the magnetic field formation line 184 may be symmetrical with respect to the center of the shield 120. In an example embodiment of the present inventive concept, the magnetic field formation line 184 may include a cable.

In an example embodiment of the present inventive concept, because the shield 120 may have the annular shape, the magnetic field formation line 184 may also have an annular shape, but the present inventive concept is not limited thereto. For example, the shield 120 may have a square frame shape, and thus, the magnetic field formation line 184 may also have a square frame shape. For example, the magnetic field formation line 184 may have various shapes configured to be symmetrical with respect to the center of the shield 120.

Further, the magnetic field formation line 184 may be positioned below the target 140 so that the magnetic field formation line 184 may be adjacent to the target 140. For example, the magnetic field formation line 184 may surround an upper portion of the outer sidewall of the shield 120. For example, the magnetic field formation line 184 may be positioned at or below the upper end of the outer sidewall of the shield 120. A current provided from the shield power supply 170 may flow through a region under the target 140.

The magnetic field formation line 184 may have a first connection point 186 and a second connection point 188. The first connection point 186 and the second connection point 188 may be symmetrical with each other with respect to the center of the shield 120. For example, the first connection point 186 and the second connection point 188 may be positioned on one straight line passing through the center of the shield 120, For example, the connection point 186 and the second connection point 188 may be respectively positioned at opposing portions of the shield 120. However, the first connection point 186 and the second connection point 188 might not be positioned on one straight line. For example, the second connection point 188 may be located on a position shifted from the straight line by a predetermined angle.

In an example embodiment of the present inventive concept, the first connection point 186 may face and/or be substantially aligned with a portion of the shield 120 to which the first shield line 190 is connected to.

The magnetic field formation line 184 may be connected with the target power supply 160 through the first connection point 186. For example, the second power line 182 may be connected to the first connection point 186.

The magnetic field formation line 184 may be connected with the shield power supply 170 through the second connection point 188. A second shield line 192 extended from the shield power supply 170 may be connected to the second connection point 188. The second shield line 192 may include a cable.

A ground line 194 may be connected to the second connection point 188 of the magnetic field formation line 184. For example, the ground line 194 may be connected to a lower structure 112 of the vacuum chamber 110. The ground line 194 may include a cable.

According to an example embodiment of the present inventive concept, the magnetic field formation line 184 may be symmetrical with respect to the center of the shield 120 so that a magnetic field generated by the magnetic field formation line 184 may also have a symmetrical shape. Further, a direction of the current flowing through the annular magnetic field formation line 184 may be opposite to a direction of a flow of the shield current so that an asymmetrical magnetic field generated by the shield current mays be offset by the magnetic field generated by the annular magnetic field formation line 184.

Referring to FIG. 2, when a radius of the shield 120 may be "a" and a radius of the magnetic field formation line 184 may be "b", a following equation may be established between the "a" and the "b" for showing the magnetic inducement effect and the magnetic field offset effect by the magnetic field formation line 184.

$$b=\sqrt{2}a$$

Therefore, when the radius of the magnetic field formation line 184 may be about $\sqrt{2}$ times the radius of the shield 120, the above-mentioned effec may be shown. However, the magnetic field formation line 184 may show the effects when the radius of the magnetic field formation line 184 may be about $\sqrt{2}\pm\sqrt{2}\times 20\%$ times the radius of the shield 120.

Figure 3:
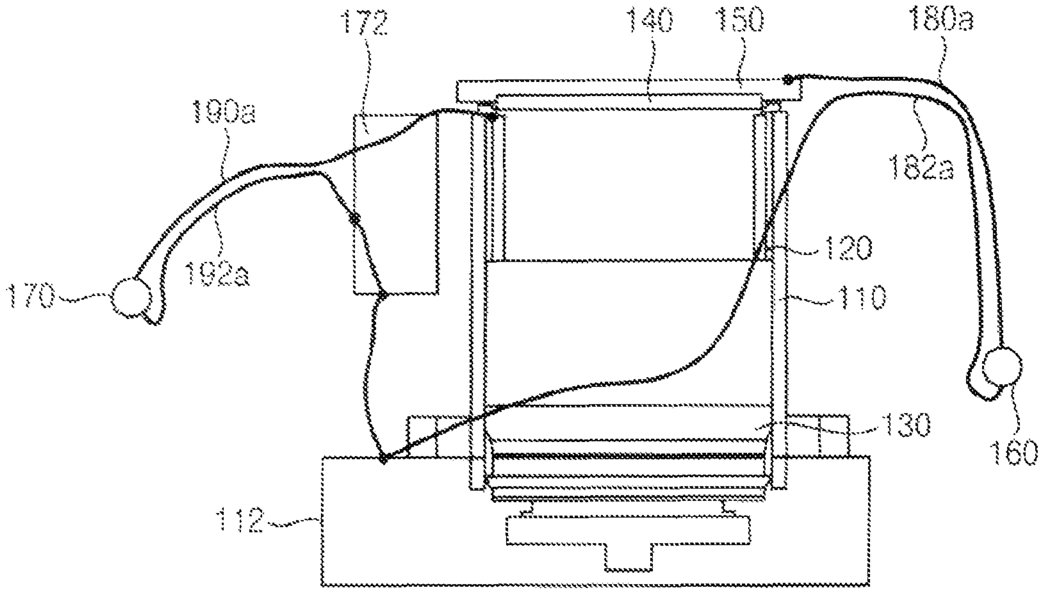
FIG. 3 is a cross-sectional view illustrating a conventional PVD apparatus in accordance with a comparative example.

Comparing a Conventional PVD Apparatus According to a Comparative Example and the PVD Apparatus According to an Example Embodiment of the Present Inventive Concept FIG. 3 is a cross-sectional view illustrating a conventional PVD apparatus in accordance with a comparative example.

The conventional PVD apparatus in FIG. 3 may include elements substantially the same as those of the PVD apparatus in FIG. 1 except for a connection structure between the target power supply and the shield power supply. Thus, the same reference numerals may refer to the same elements and any further illustrations or discussion with respect to the same elements may, be omitted herein for brevity.

Referring to FIG. 3, the target, power supply 160 may be connected with the target 140 through a first power line 180*a*. A second power line 182*a* extended from the target power supply 160 may be grounded to the lower structure 112 of the vacuum chamber 110 by crossing over one sidewall of the vacuum chamber 110. The shield power supply 170 may be connected with the shield 120 through a first shield line 190*a*. A second shield line 192*a* extended from the shield power supply 170 may be grounded to the lower structure 112 of the vacuum chamber 110. That is, the conventional PVD apparatus according to a comparative example might not include the annular magnetic field formation line 184 in FIG. 1.

Figure 4:
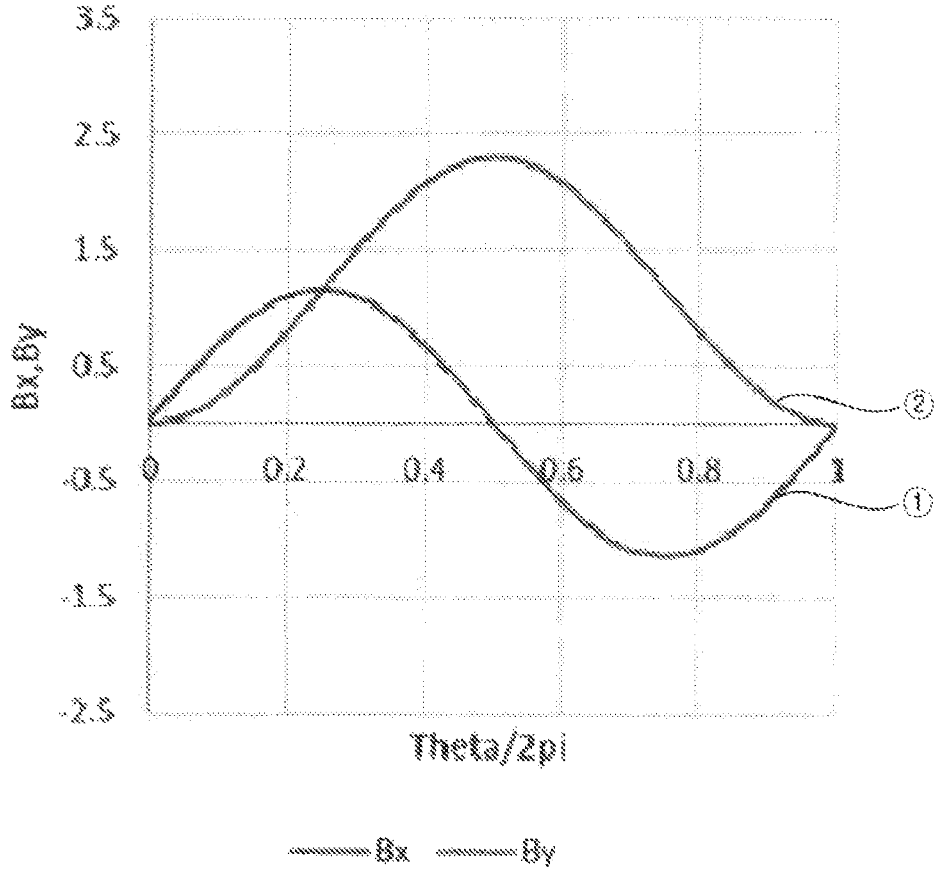
FIG. 4 is a graph showing magnetic field components formed in the conventional PVD apparatus in FIG. 3 in accordance with a comparative example.

FIG. 4 is a graph showing magnetic field components formed in the conventional PVD apparatus in FIG. 3 according to a comparative example. In FIG. 4, a line ① may represent x components of a magnetic field and a line ② may represent y components of the magnetic field.

As shown in FIG. 4, it can be noted that an average value of the y components of the magnetic field caused by a shield current in accordance with a rotation of the magnet may be a positive number. Thus, they components of the magnetic field may be deflected in left and right directions so that the magnetic field may have an asymmetrical shape.

Figure 5:
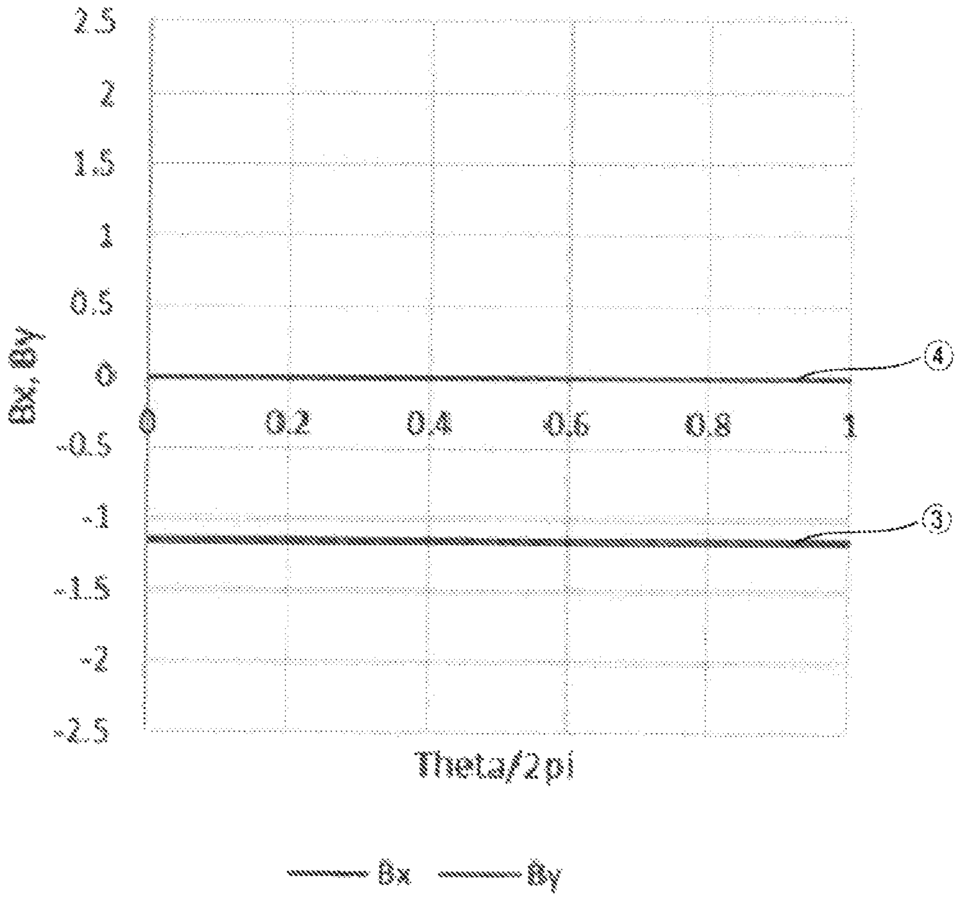
FIG. 5 is a graph showing magnetic field components formed by a magnetic field formation line of the PVD apparatus in FIG. 1 in accordance with an example embodiment of the present inventive concept.

FIG. 5 is a graph showing, magnetic field components formed by a magnetic field formation line of the PVD apparatus in FIG. 1 according to an example embodiment of the present inventive concept. In FIG. 5, a line ③ may represent x components of a magnetic field and a line ④ may represent y components of the magnetic field.

As shown in FIG. 5, it can be noted that the y components of the magnetic field formed by the magnetic field formation line may have a constant value of about zero, and the x components of the magnetic field may have a constant value of about −1.2.

Figure 6:
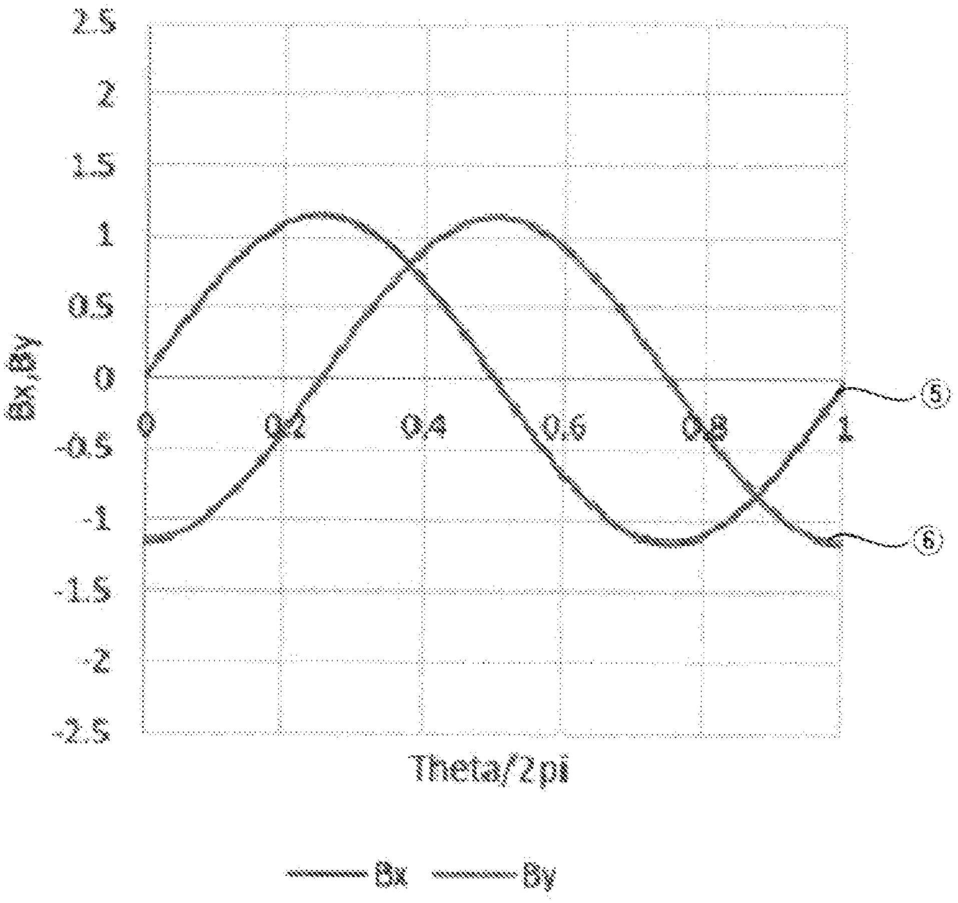
FIG. 6 is a graph showing magnetic field components formed in the PVD apparatus in FIG. 1 by the magnetic field components in FIG. 5.

FIG. 6 is a graph showing magnetic field components formed in the PVD apparatus in FIG. 1 by the magnetic field components in FIG. 5. In FIG. 6, a line ⑤ may represent the components of the magnetic field and a line ⑥ may represent the y components magnetic field.

As shown in FIG. 6, it can be noted that an average value of the y components of the magnetic field may be about zero. Thus, the magnetic field in FIG. 5 formed by the annular magnetic field formation line may offset the magnetic field in FIG. 4 formed by the shield current. As a result, it can be noted that the annular magnetic field formation line may form the symmetrical magnetic field.

Figure 7:
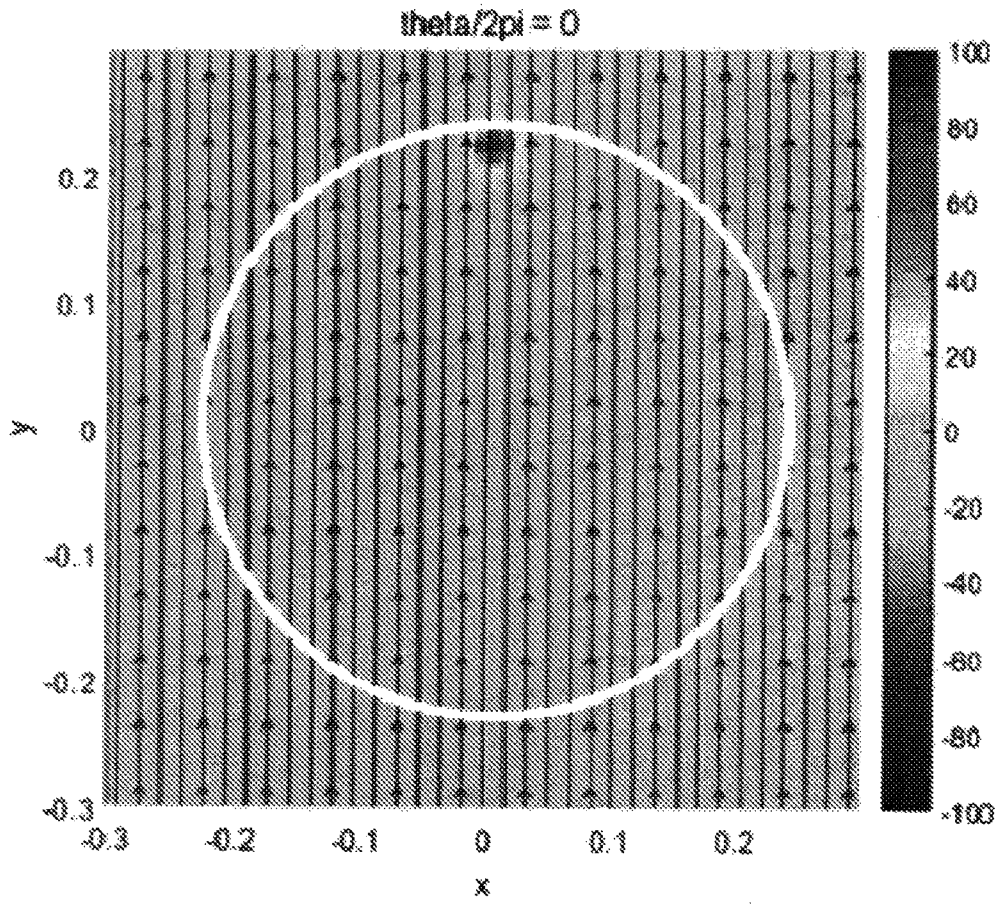
FIG. 7 is an image showing a magnetic field formed by the conventional PVD apparatus in FIG. 3 in accordance with a comparative example.
Figure 8:
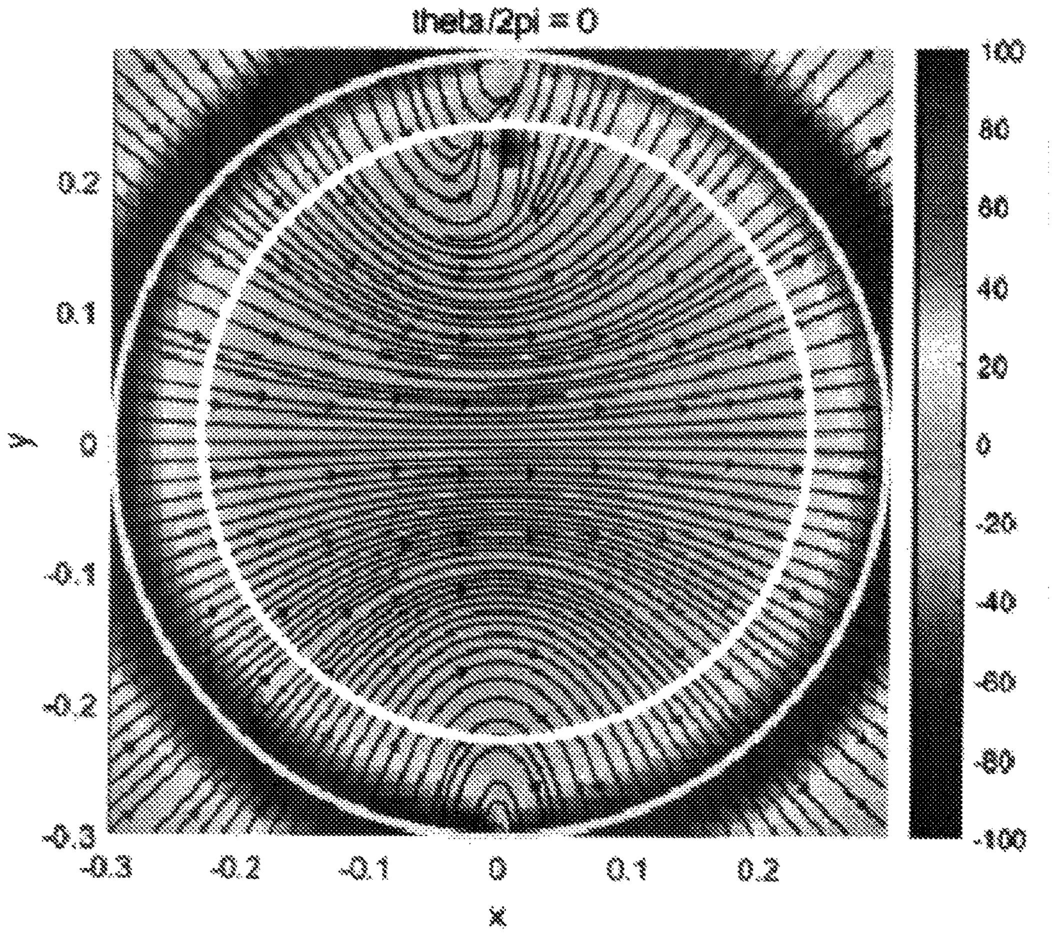
FIG. 8 is an imago showing a magnetic field formed by a magnetic field formation line of the PVD apparatus in FIG. 1 in accordance with an example embodiment of the present inventive concept.

FIG. 7 is an image showing a magnetic field formed by the conventional PVD apparatus in FIG. 3, and FIG. 8 is an image showing a magnetic field formed by a magnetic field formation line of the PVD apparatus in FIG. 1 according to an example embodiment of the present inventive concept.

As shown in FIG. 7, it can be noted that the magnetic field formed by the shield current in accordance with the rotation of the magnet may be deflected to the left.

In contrast, as shown in FIG. 8 it can the noted that the magnetic field formed by the annular magnetic field formation line may have the symmetrical shape.

Figure 9:
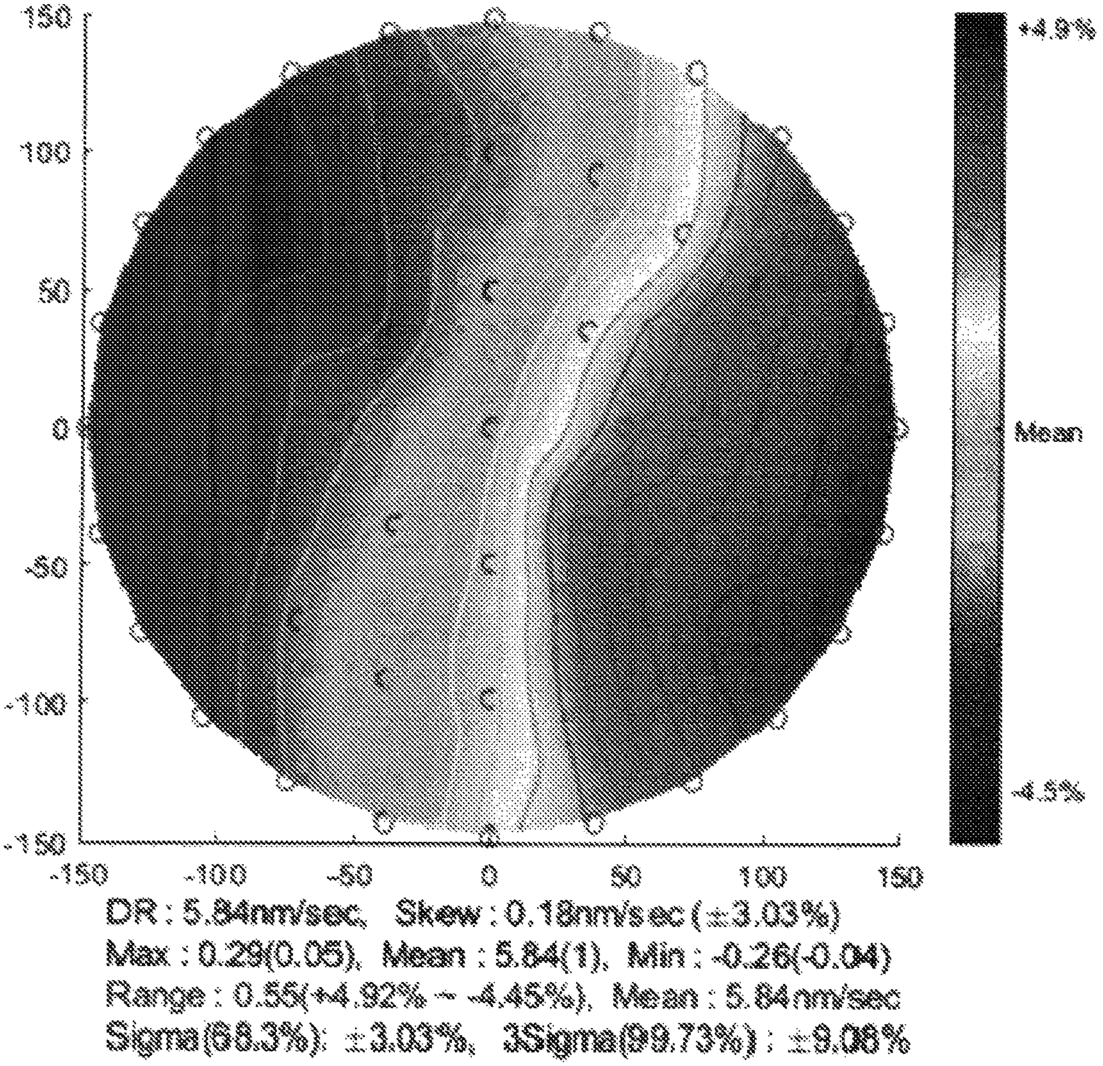
FIG. 9 is an image showing a distribution of plasma in the conventional PVD apparatus in FIG. 3.
Figure 10:
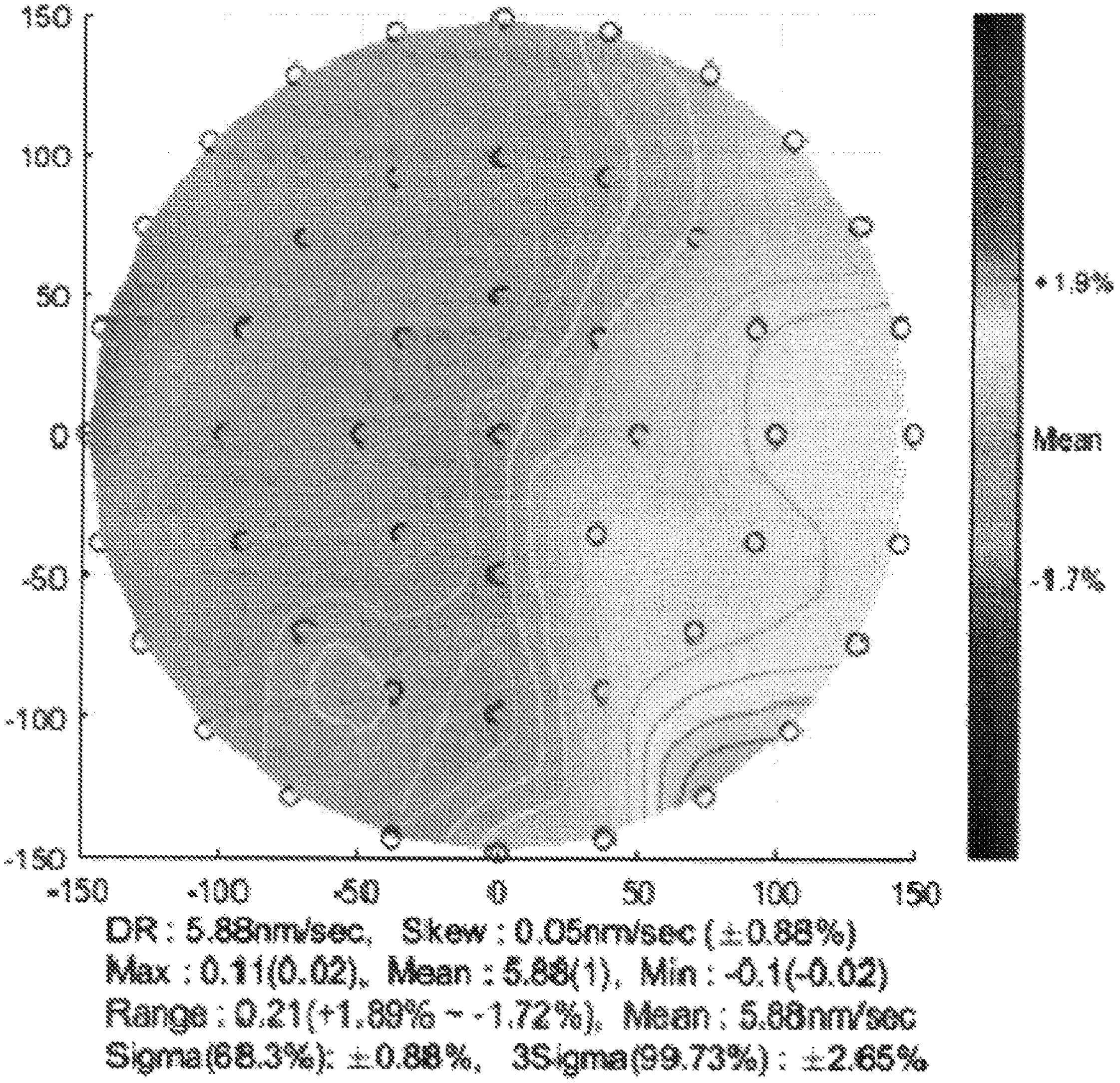
FIG. 10 is an image showing a distribution of plasma in the IND apparatus in FIG. 1 accordance with an example embodiment of the present inventive concept.

FIG. 9 is an image showing a distribution of plasma in the conventional PVD apparatus in FIG. 3 according to a comparative example, and FIG. 10 is an image showing a distribution of plasma in the PVD apparatus in FIG. 1 according to an example embodiment of the present inventive concept.

As shown in FIG. 9, it can be noted that the magnetic field formed M the conventional PVD apparatus may be excessively deflected right. Thus, it can also be noted that plasma induced by the asymmetrical magnetic field may also be excessively deflected right.

In contrast, as shown in FIG. 10, because the annular magnetic field formation line may form the symmetrical magnetic field, it can be noted that the plasma induced by the symmetrical magnetic field may have a substantially uniform distribution.

Figure 11:
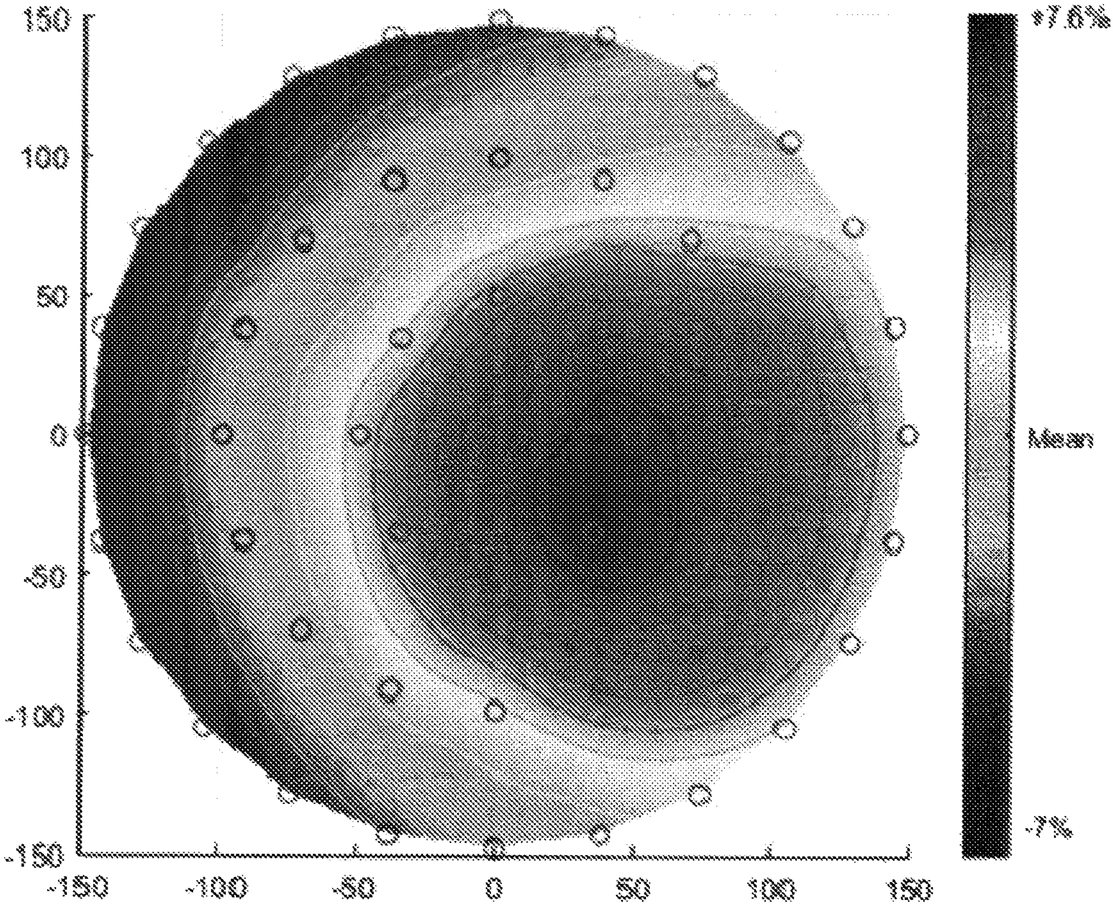
FIG. 11 is an image showing a thickness distribution of a layer on a substrate using the conventional PVD apparatus in FIG. 3 in accordance with a comparative example.
Figure 12:
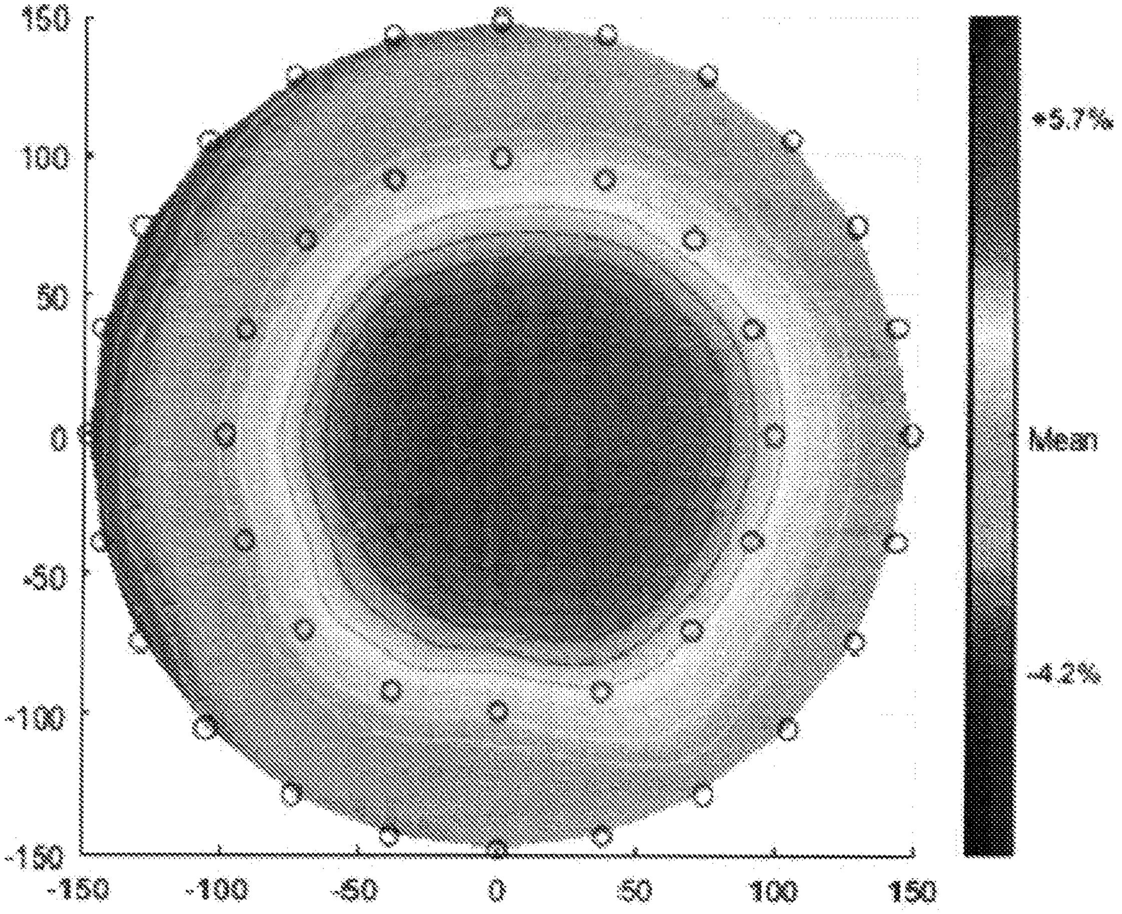
FIG. 12 is an image showing a thickness distribution of a layer on a substrate using the PVD apparatus in FIG. 1 in accordance with an example embodiment of the present inventive concept.

FIG. 11 is an image showing a thickness distribution of a layer on a substrate using the conventional PVD apparatus in FIG. 3 according to a comparative example, and FIG. 12 is an image showing a thickness distribution of a layer on a substrate using the PVD apparatus in FIG. 1 according to an example embodiment of the present inventive concept.

As shown in FIG. 11, it can be noted that a thickness of a portion on the right side of a layer deposited on the semiconductor substrate may be thicker than a thickness of a portion on the left side of the layer due to the plasma induced by the asymmetrical magnetic field.

In contrast, as shown in FIG. 12, it can be noted that a layer deposited on the semiconductor substrate may have a substantially uniform thickness due to the plasma induced by the symmetrical magnetic field.

Figure 13:
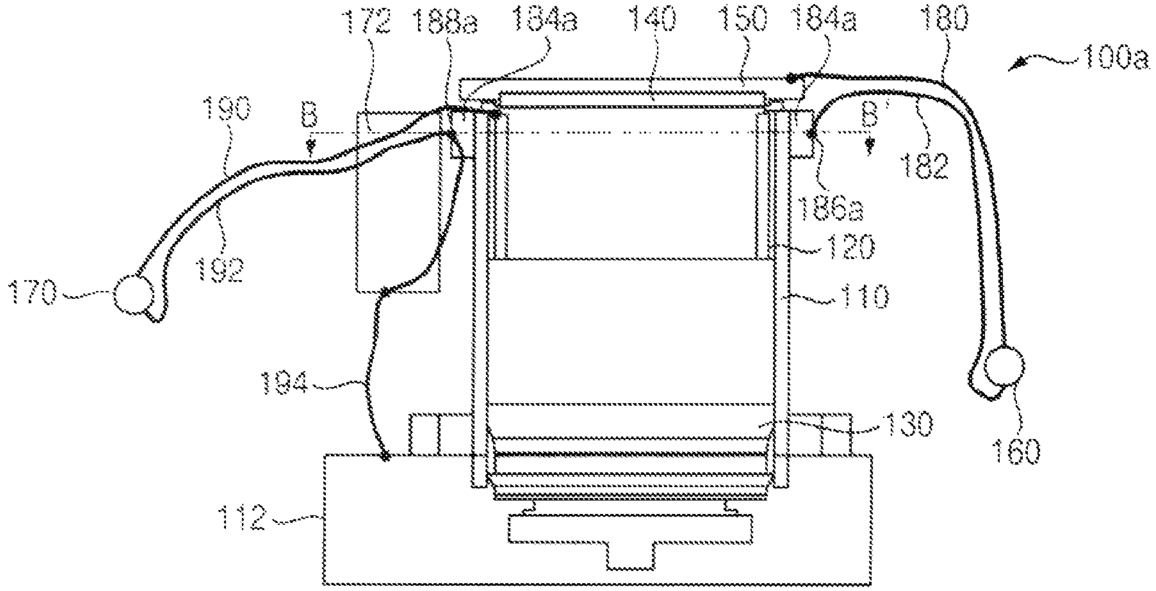
FIG. 13 is a cross-sectional view illustrating a PVD apparatus in accordance with an example embodiment of the present inventive concept.
Figure 14:
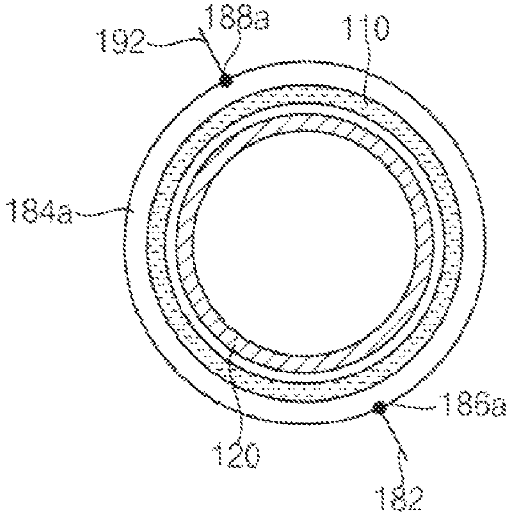
FIG. 14 is a cross-sectional view taken along a line B-B' in FIG. 13 in accordance with an example embodiment of the present inventive concept.

FIG. 13 is a cross-sectional view illustrating a PVD apparatus in accordance with an example embodiment of the present inventive concept, and FIG. 14 is a cross-sectional view taken along a line B-B' in FIG. 13.

A PVD apparatus 100*a* according to an example embodiment of the present inventive concept may include elements substantially the same as those of the PVD apparatus 100 in FIG. 1 except for a magnetic field formation fine. Thus, the same reference numerals may refer to the same elements and any further illustrations or discussion with respect to the same elements may be omitted herein for brevity.

Referring to FIGS. 13 and 14, a magnetic field formation line may include a conductive ring 184*a* configured to surround the outer sidewall of the vacuum chamber 110. For example, the conductive ring 184*a* may make contact with the outer sidewall of the vacuum chamber 110. In an example embodiment of the present inventive concept, the conductive ring 184*a* may include flange integrally formed with the outer sidewall of the vacuum chamber 110. The second power line 182 may be connected to the first connection point 186*a* of the conductive ring 184*a*. Thus: the conductive ring 184*a* may be electrically connected with the target power supply 160. The second shield line 192 extended from the shield power supply 170 may be connected to the second connection point 188*a* of the conductive ring 184*a*. The ground line 194 may be connected to the second connection point 188*a* of the conductive ring 184*a*.

Figure 15:
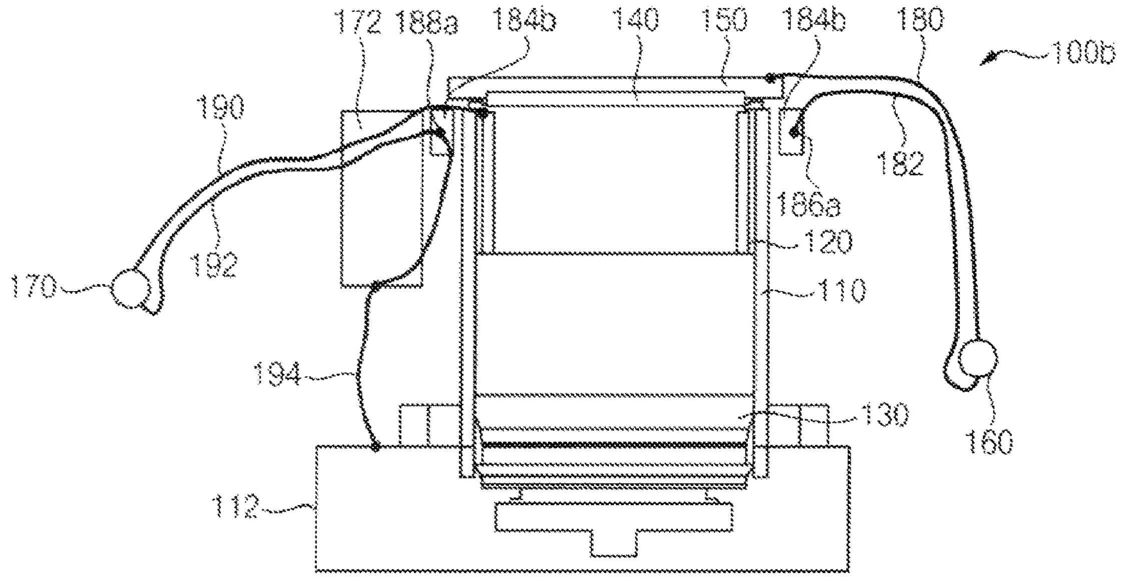
FIG. 15 is a cross-sectional view illustrating a PVD apparatus in accordance with an example embodiment of the present inventive concept.

FIG. 15 is a cross-sectional view illustrating, a PVD apparatus in accordance with an example embodiment of the present inventive concept.

A PVD apparatus 100*b* of example embodiments may include elements substantially the same as those of the PVD apparatus 100 in FIG. 14 except for a conductive ring. Thus, the same reference numerals may refer to the same elements and any further illustrations or discussion with respect to the same elements may be omitted herein for brevity.

Referring to FIG. 15, a conductive ring 184*b* may be spaced apart from the outer sidewall of the vacuum chamber 110. Thus, a space may be formed between the conductive ring 184*b* and the outer sidewall of the vacuum chamber 110. The conductive ring 184*b* may be fixed to the lower structure 112 of the vacuum chamber 110.

Figure 16:
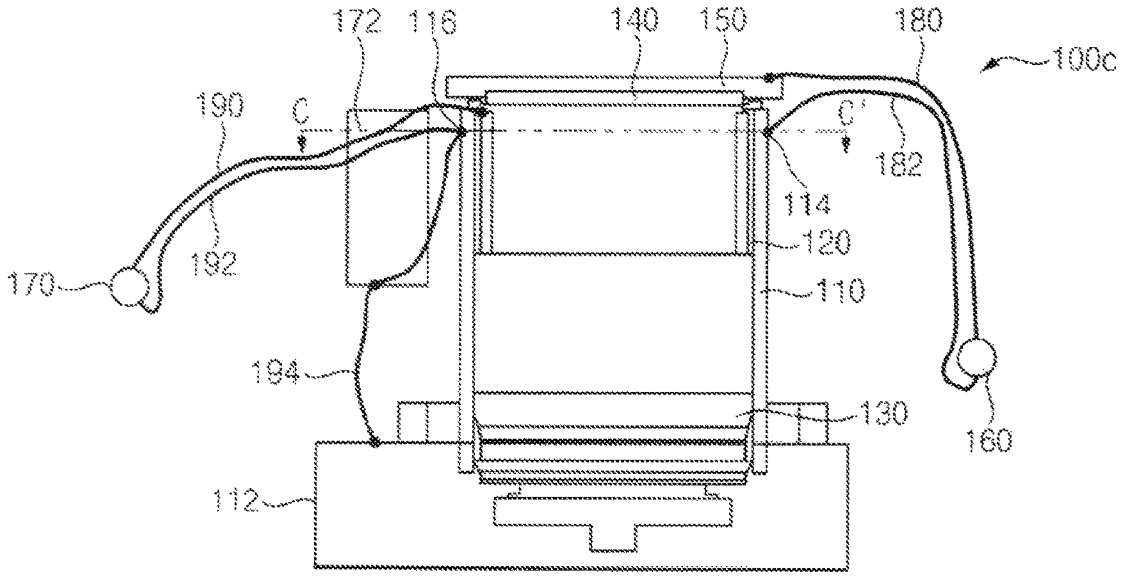
FIG. 16 is a cross-sectional view illustrating a PVD apparatus in accordance with an example embodiment of the present inventive concept.
Figure 17:
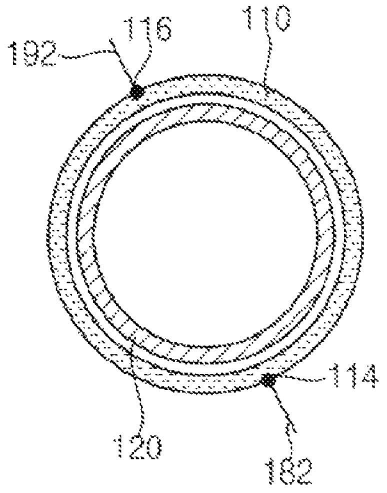
FIG. 17 is a cross-sectional view taken along a line C-C' in FIG. 16 in accordance with an example embodiment of the present inventive concept.

FIG. 16 is a cross-sectional view illustrating a PVD apparatus in accordance with an example embodiment of the present inventive concept, and FIG. 17 is a cross-sectional view taken along a line C-C' in FIG. 16.

A PVD apparatus 100*c* according to an example embodiment of the present inventive concept may include elements substantially the same as those of the PVD apparatus 100 in FIG. 1 except for a magnetic field formation line. Thus, the same reference numerals may refer to the same elements and any further illustrations or discussion with respect to the same elements may be omitted herein for brevity.

Referring to FIGS. 16 and 17, a vacuum chamber 110 may include a conductive material. For example, the vacuum chamber 110 may include a metal.

The second power line 182 extended from the target power supply 160 may be connected to a fust portion 114 of the outer sidewall of the vacuum chamber 110. The second shield line 192 extended from the shield power supply 170 may be connected to a second portion 116 of the outer sidewall of the vacuum chamber 110. The first portion 114 and the second portion 116 of the vacuum chamber 110 may be symmetrical with respect to the center of the shield 120. For example, the first portion 114 may be at a position opposing that of the second portion 116.

Therefore, the annular sidewall of the vacuum chamber 110 including the conductive material may have the functions of the magnetic field formation line 184 in FIG. 1.

Figure 18:
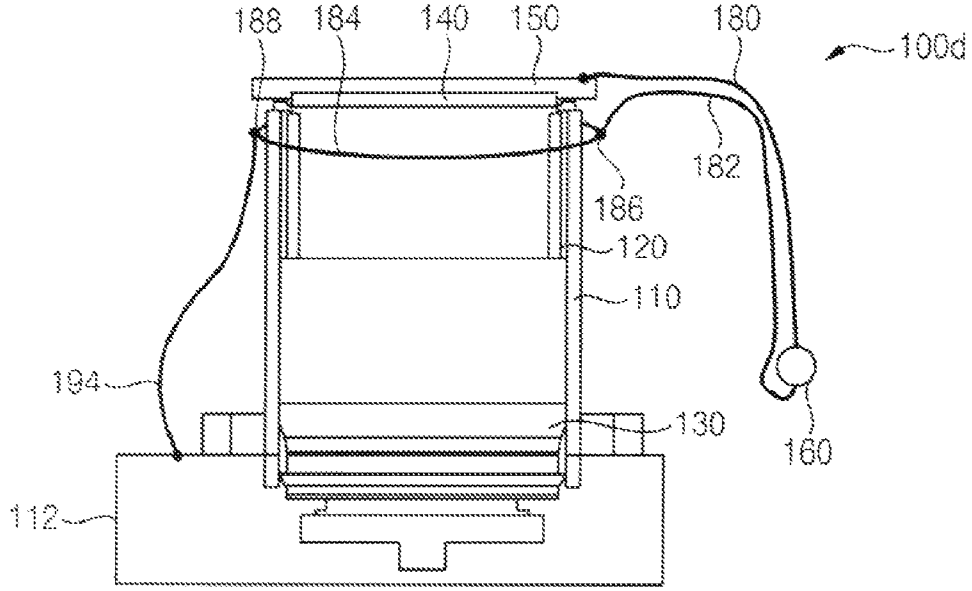
FIG. 18 is a cross-sectional view illustrating a PVD apparatus in accordance with an example embodiment of the present inventive concept.

FIG. 18 is a cross-sectional view illustrating a PVD apparatus in accordance with an example embodiment of the present inventive concept.

A PVD apparatus 100*d* according to an example embodiment of the present inventive concept may include elements substantially the same as those of the PVD apparatus 100 in FIG. 1 except for not including a shield power supply. Thus, the same reference numerals may refer to the same elements and any further illustrations or discussion with respect to the same elements may be omitted herein for brevity.

Referring to FIG. 18, the PVD apparatus 100*d* according to an example embodiment of the present inventive concept might not include the shield power supply. Thus, the shield voltage might not be applied to the shield 120. Therefore, the PVD apparatus 100*d* might not include a first shield line, which is connected to the shield power supply 170 and the shield 120, and a second shield line, which is connected to the shield power supply 170 and the second point 188 of the magnetic field formation line 184.

Figure 19:
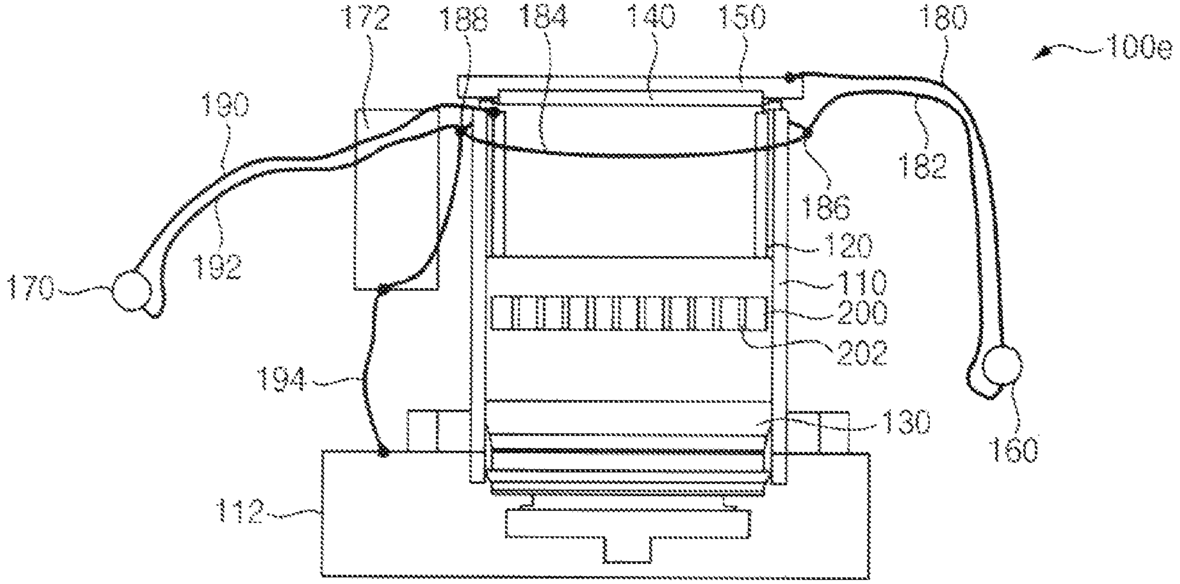
FIG. 19 is a cross-sectional view illustrating a PVD apparatus in accordance with example embodiment of the present inventive concept.

FIG. 19 is a cross-sectional view illustrating a PVD apparatus in accordance with an example embodiment of the present inventive concept.

A PVD apparatus 100*e* according to an example embodiment of the present inventive concept may include elements substantially the same as those of the PVD apparatus 100 in FIG. 1 and may further include a collimator. Thus, the same reference numerals may refer to the same elements and any further illustrations or discussion with respect to the same elements may be omitted herein for brevity.

Referring to FIG. 19, a collimator 200 may be arranged between the target 140 and the pedestal 130. The collimator 200 may have a substantially uniform thickness. The collimator 200 may have a plurality of passages 202. The deposition material released from the target 140 may partially pass through the passages 202 of the collimator 200 to filter the deposition material.

In an example embodiment of the present inventive concept, the PVD apparatuses according to an example embodiment of the present inventive concept may further include a magnetic field generation module for controlling the plasma and ions.

According to an example embodiment of the present inventive concept, the magnetic field formation line may be configured to surround the shield so that the magnetic field formation line may be symmetrical with respect to the center of the shield. Thus, a symmetrical magnetic field may be formed from the symmetrical magnetic field formation line. As a result, the symmetrical magnetic field may distribute the plasma in a substantially unifomi manner to form a layer having a substantially uniform thickness on the substrate.

It is to be understood that in the claims, means-plus-function clauses are intended to cover the structures described herein as performing the recited function and not only structural equivalents but also equivalent structures.

While the present inventive concept has been described with reference to example embodiments thereof, it will be understood by those of ordinary skill in the art that various changes in form and details may be made thereto without departing from the spirit and scope of the present inventive concept.

What is claimed is:

1. A physical vapor deposition (PVD) apparatus comprising:

a vacuum chamber;

a pedestal arranged in the vacuum chamber and configured to support a substrate;

a target arranged on the vacuum chamber and including a deposition material;

a shield arranged on an inner sidewall of the vacuum chamber to protect the vacuum chamber from the deposition material;

a target power supply applying a target voltage to the target to generate plasma in the vacuum chamber;

a magnet configured to induce the plasma to the target;

a magnetic field formation line having a first connection point connected with the target power supply, wherein a first target line is directly connected to the target power supply and magnetic field formation line, wherein the magnetic field formation line has an annular shape configured to surround the shield symmetrically with respect to a center of the shield to form a magnetic field in the vacuum chamber;

a ground line connected to a second connection point of the magnetic field formation line and a lower structure of the vacuum chamber, wherein the second connection point is symmetrical with the first connection point with respect to the center of the shield; and a shield power supply configured to apply a shield voltage to the shield, wherein a first shield line is directly connected to the shield power supply and the magnetic field formation line at the second connection point, wherein the magnetic field formation line is disposed outside of the vacuum chamber.

2. The PVD apparatus of claim 1, wherein the magnetic field formation line has a radius of about $\sqrt{2}\pm v/\sqrt{2}\times 20\%$ times a radius of the shield.

3. The PVD apparatus of claim 1, further comprising a collimator arranged between the target and the pedestal.

* * * * *